(12) United States Patent
Iwaki

(10) Patent No.: US 9,093,976 B2
(45) Date of Patent: Jul. 28, 2015

(54) SWITCHING DEVICE AND MODULE

(71) Applicant: TAIYO YUDEN CO., LTD., Tokyo (JP)

(72) Inventor: Masafumi Iwaki, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 33 days.

(21) Appl. No.: 14/055,020

(22) Filed: Oct. 16, 2013

(65) Prior Publication Data

US 2014/0125428 A1    May 8, 2014

(30) Foreign Application Priority Data

Nov. 8, 2012    (JP) .................................. 2012-246539

(51) Int. Cl.
| | |
|---|---|
| H03H 9/36 | (2006.01) |
| H03K 17/693 | (2006.01) |
| H03H 9/42 | (2006.01) |
| H03H 9/58 | (2006.01) |
| H03H 9/64 | (2006.01) |

(52) U.S. Cl.
CPC ............... *H03H 9/36* (2013.01); *H03K 17/693* (2013.01); *H03H 9/42* (2013.01); *H03H 9/585* (2013.01); *H03H 9/587* (2013.01); *H03H 9/6436* (2013.01)

(58) Field of Classification Search
USPC ....................... 455/196.1, 255, 315, 552.1, 78; 333/133, 193, 195
See application file for complete search history.

(56) References Cited

U.S. PATENT DOCUMENTS

| | | | | |
|---|---|---|---|---|
| 5,107,267 | A * | 4/1992 | Janusas et al. | 342/15 |
| 6,559,736 | B2 * | 5/2003 | Lu et al. | 333/152 |
| 7,848,712 | B2 | 12/2010 | Fu et al. | |

* cited by examiner

*Primary Examiner* — Dinh Le
(74) *Attorney, Agent, or Firm* — Chen Yoshimura LLP

(57) ABSTRACT

A switching device includes: a switch that selects and connects one of input-output terminals to a common terminal; and a delay line that is connected in parallel to the switch between two terminals of the input-output terminals and delays a signal by using an acoustic wave.

10 Claims, 15 Drawing Sheets

SWITCHING DEVICE AND MODULE

CROSS-REFERENCE TO RELATED APPLICATION

This application is based upon and claims the benefit of priority of the prior Japanese Patent Application No. 2012-246539, filed on Nov. 8, 2012, the entire contents of which are incorporated herein by reference.

FIELD

A certain aspect of the present invention relates to a switching device and a module.

BACKGROUND

The rapid spread of wireless devices as typified by mobile phones has promoted the use of switching devices. For example, mobile terminals for high frequency communications use a high frequency switch to select multiple high-frequency signals. The switches include mechanical switches and switches using a semiconductor transistor.

Japanese Patent Application Publication No. 2006-109084 (Patent Document 1) and U.S. Pat. No. 7,848,712 (Patent Document 2) disclose providing an inductor between input-output terminals to improve isolation characteristics between the input-output terminals of the switch.

The techniques of Patent Documents 1 and 2 can cancel out parasitic capacitance between the input-output terminals by a reactance component of the inductor and improve the isolation characteristics. However, a parasitic capacitance value between the input-output terminals is small, and thus the inductance of the inductor is made to be high. This makes downsizing difficult.

SUMMARY OF THE INVENTION

According to an aspect of the present invention, there is provided a switching device including: a switch that selects and connects one of input-output terminals to a common terminal; and a delay line that is connected in parallel to the switch between two terminals of the input-output terminals and delays a signal by using an acoustic wave.

According to an aspect of the present invention, there is provided a module including the above described switching device.

DETAILED DESCRIPTION

Hereinafter, a description will be given of embodiments with reference to the attached drawings.

First Embodiment

Figure 1A:
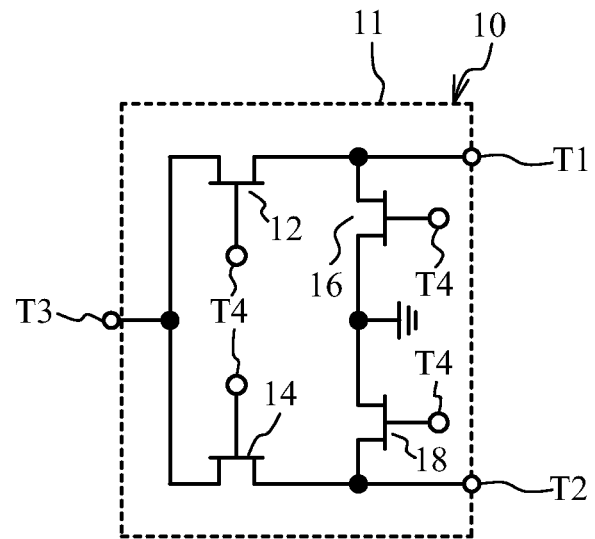
FIG. 1A is a circuit diagram of a switch used in a switching device.

A description will be given of a semiconductor switch as an example of a switch used in a switching device. FIG. 1A is a circuit diagram of a switch used in a switching device. As illustrated in FIG. 1A, a switch 10 includes transistors 12 through 18. The source and the drain of the transistor 12 are coupled to an input-output terminal T1 and a common terminal T3, respectively. The source and the drain of the transistor 14 are coupled to an input-output terminal T2 and the common terminal T3, respectively. The source and the drain of the transistor 16 are coupled to the input-output terminal T1 and a ground, respectively. The source and the drain of the transistor 18 are coupled to the input-output terminal T2 and the ground, respectively. The gates of the transistors 12 through 18 are coupled to control terminals T4.

Figure 1B:
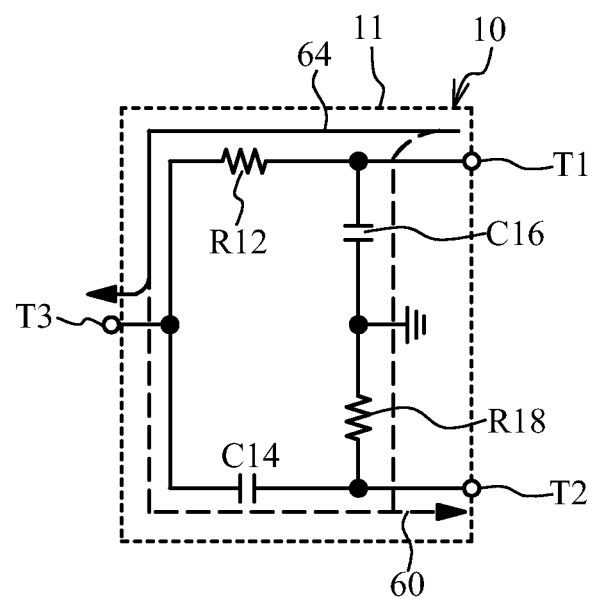
FIG. 1B is a diagram to explain isolation of the switch.

FIG. 1B is a diagram to explain isolation of the switch. As illustrated in FIG. 1B, control signals supplied to the control terminals T4 turn on the transistors 12 and 18, and turn off the transistors 14 and 16. The transistors 12 and 18 are equivalently represented as resistors R12 and R18, and the transistors 14 and 16 are equivalently represented as capacitors C14 and C16. The input-output terminal T1 is coupled to the common terminal T3, and the input-output terminal T2 is disconnected from the common terminal T3. As described above, the switch 10 selects and couples one of the input-output terminals T1 and T2 to the common terminal T3. This causes a high-frequency signal 64 input from the input-output terminal T1 to be output to the common terminal T3. A signal 60 that is a part of the high-frequency signal leaks from the input-output terminal T1 to the input-output terminal T2 through the capacitors C14 and C16. This deteriorates isolation between the input-output terminals T1 and T2.

Figure 2:
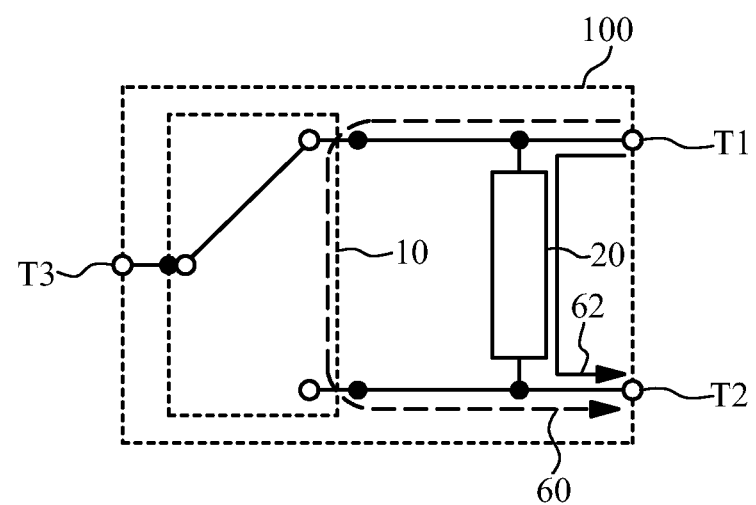
FIG. 2 is a block diagram of a switching device in accordance with a first embodiment.

FIG. 2 is a block diagram of a switching device in accordance with a first embodiment. A switching device 100 includes the switch 10 and a delay line 20. The switch 10 is a semiconductor switch or a mechanical switch. An FET such as a MOSFET (Metal Oxide Semiconductor Field Effect Transistor) or a bipolar transistor may be used as an active element for the semiconductor switch. The delay line 20 is connected in parallel to the switch 10 between the input-output terminals T1 and T2. It is sufficient if the delay line 20 is connected between two terminals of the input-output terminals.

The signal 60 is a signal leaking from the input-output terminal T1 to the input-output terminal T2 through the switch 10. A signal 62 is a signal flowing from the input-output terminal T1 to the input-output terminal T2 through the delay line 20. The delay line 20 delays the signal 62 with an acoustic wave. Thus, the adjustment of the delay line 20 enables to make the signals 60 and 62 have approximately the same amplitude and opposite phases. Therefore, the signals 60 and 62 cancel out each other, and the isolation characteristics from the input-output terminal T1 to the input-output terminal T2 is improved. Moreover, the use of the delay line 20 using the acoustic wave enables to reduce the size compared to the techniques disclosed in Patent Documents 1 and 2.

Second Embodiment

Figure 3A:
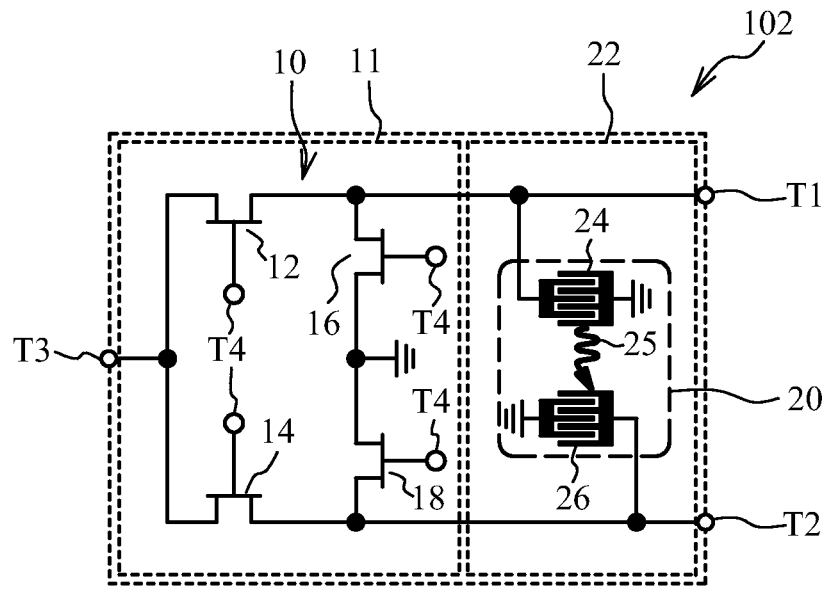
FIG. 3A is a plan view of a switching device in accordance with a second embodiment.
Figure 3B:
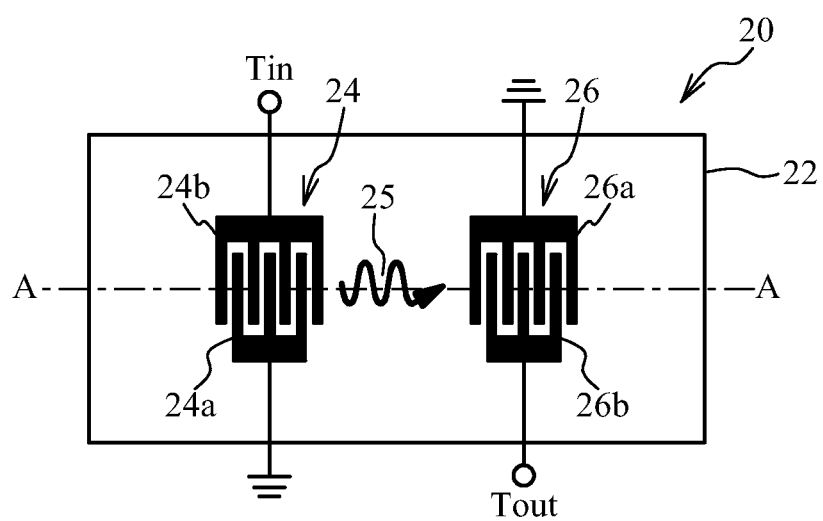
FIG. 3B is a plan view of a delay line.
Figure 3C:
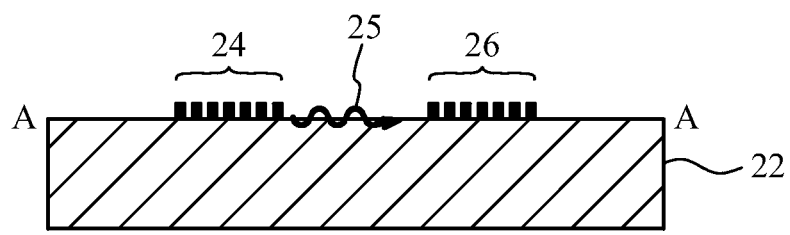
FIG. 3C is a cross-sectional view taken along line A-A in FIG. 3B.

A second embodiment uses an acoustic wave excited by a comb-shaped electrode on a piezoelectric layer as the acoustic wave of the delay line. FIG. 3A is a plan view of a switching device in accordance with the second embodiment, FIG. 3B is a plan view of a delay line, and FIG. 3C is a cross-sectional view taken along line A-A in FIG. 3B. As illustrated in FIG. 3A, a switching device 102 includes the switch 10 and the delay line 20. The switch 10 has the same structure as that in FIG. 1A, and a description thereof is omitted. The delay line 20 is connected in parallel to the switch 10 between the input-output terminals T1 and T2.

As illustrated in FIG. 3B and FIG. 3C, the delay line 20 includes IDTs (Interdigital Transducer) 24 and 26 formed on a piezoelectric substrate 22 (piezoelectric layer). The IDT 24 (first IDT) includes a pair of comb-shaped electrodes 24a and 24b. The comb-shaped electrode 24a is grounded while the comb-shaped electrode 24b is coupled to an input terminal Tin. The IDT 26 (second IDT) includes a pair of comb-shaped electrodes 26a and 26b. The comb-shaped electrode 26a is grounded while the comb-shaped electrode 26b is coupled to an output terminal Tout. The input terminal Tin is electrically connected to the input-output terminal T1. The output terminal Tout is electrically connected to the input-output terminal T2. The IDT 24 converts an electrical signal input to the input terminal Tin into a surface acoustic wave 25 of the piezoelectric substrate 22. The IDT 26 converts the surface acoustic wave 25 of the piezoelectric substrate 22 into an electrical signal, and outputs it to the output terminal Tout. Other structures are the same as those of the first embodiment, and a description thereof is omitted.

Figure 4A:
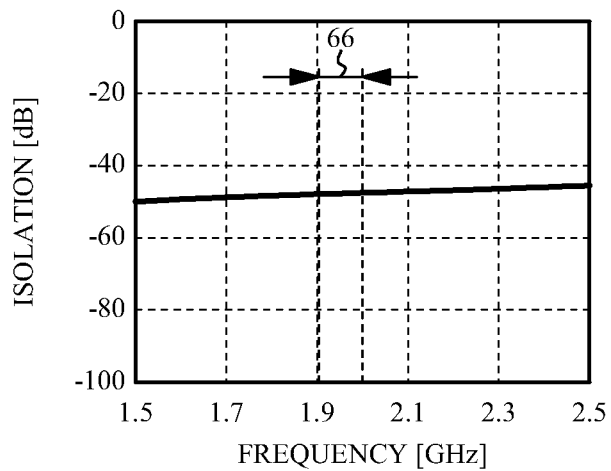
FIG. 4A through FIG. 4C are diagrams respectively illustrating isolation, $|Y21|$, and $\angle Y21$ between input-output terminals of a switch.
Figure 4B:
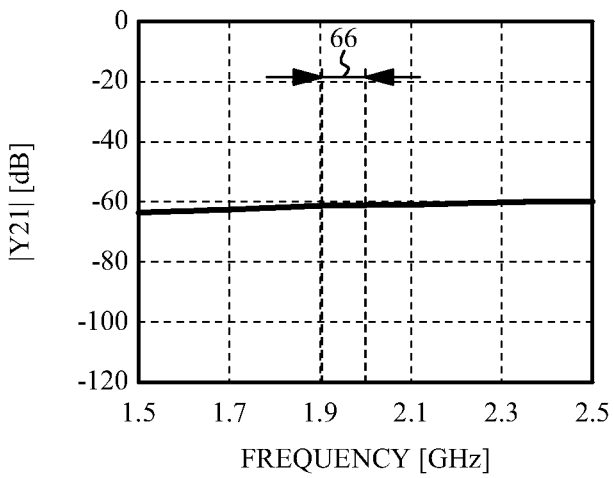
Figure 4C:
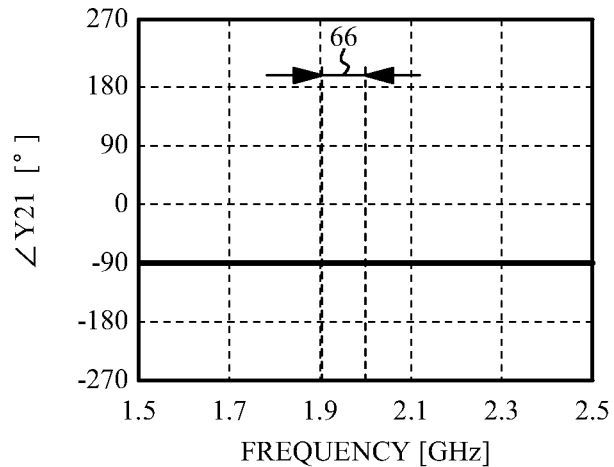

FIG. 4A through FIG. 4C are diagrams respectively illustrating isolation, |Y21|, and ∠Y21 between the input-output terminals of the switch. The switch 10 is a switch using a CMOSFET (Complimentary MOSFET). The isolation is isolation (S21) between the input-output terminals T1 and T2, |Y21| is an amplitude of Y21 between the input-output terminals T1 and T2, and ∠Y21 is a phase of Y21 between the input-output terminals T1 and T2. The isolation, |Y21|, and ∠Y21 were simulated with respect to frequency from 1.5 GHz to 2.5 GHz. A band 66 is a band improving isolation characteristics, and is, for example, a transmit band or a receive band of a mobile terminal using the switching device.

As illustrated in FIG. 4A, the isolation in the band 66 is approximately −45 dB. As illustrated in FIG. 4B, |Y21| in the band 66 is approximately −60 dB. As illustrated in FIG. 4C, ∠Y21 in the band 66 is approximately −90°. As described above, a capacitive reactance component (i.e. parasitic capacitance) exists between the input-output terminals T1 and T2.

Figure 5A:
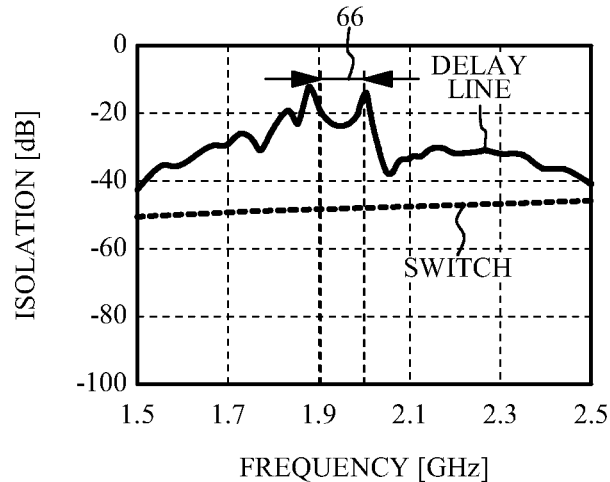
FIG. 5A through FIG. 5C are diagrams respectively illustrating isolation, $|Y21|$, and $\angle Y21$ of the delay line and the switch of the second embodiment.
Figure 5B:
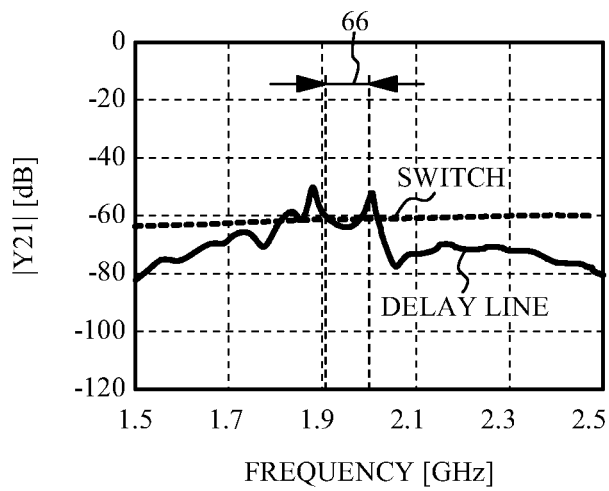
Figure 5C:
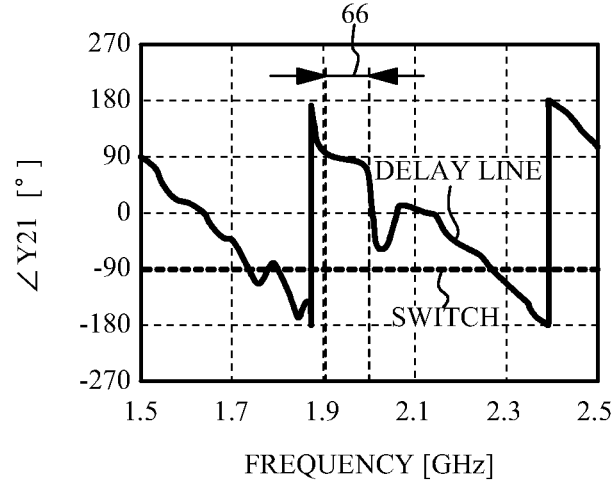

FIG. 5A to FIG. 5C are diagrams respectively illustrating isolation, |Y21|, and ∠Y21 of the delay line and the switch of the second embodiment. The solid lines indicate the delay line 20, and the dotted lines indicate the switch 10 (same as those in FIG. 4A to FIG. 4C). The isolation, |Y21|, and ∠Y21 were simulated under the following conditions.

Piezoelectric substrate 22: 44° Y-cut lithium tantalate single crystal substrate IDT 24: number of pairs: 2.5 pairs, pitch: 1.98 µm, aperture length: 65λ

IDT 26: number of pairs: 3 pairs, pitch: 2.00 µm, aperture length: 65λ

Interval between the IDTs 24 and 26: 2.15 µm

λ is the wavelength of the acoustic wave.

As illustrated in FIG. 5A, the isolation of the delay line 20 is greater than that of the switch 10. As illustrated in FIG. 5B, |Y21| of the delay line 20 in the band 66 is approximately equal to that of the switch 10. As illustrated in FIG. 5C, ∠Y21 of the delay line 20 in the band 66 is approximately 90°, and has a phase opposite to that of the switch 10. As described above, the optimization of the IDTs 24 and 26 enables to make the signal 60 through the switch 10 have approximately the same amplitude as and the opposite phase to the signal 62 through the delay line 20.

Figure 6:
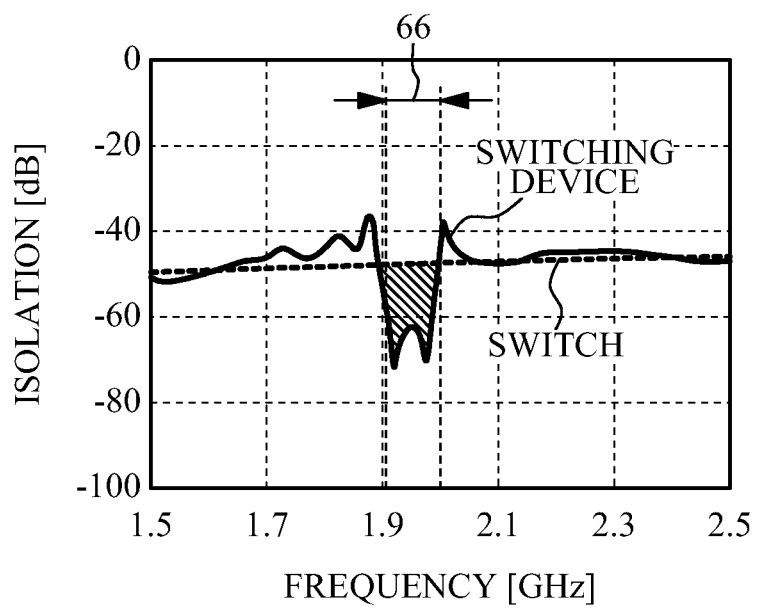
FIG. 6 is a diagram illustrating isolation characteristics of the switching device in accordance with the second embodiment.

FIG. 6 is a diagram illustrating isolation characteristics of the switching device of the second embodiment. The solid line indicates simulation results of isolation from the input-output terminal T1 to the input-output terminal T2 of the switching device 102. The dotted line indicates simulation results from the input-output terminals T1 to the input-output terminal T2 of the switch 10 alone. As illustrated in FIG. 6, in the band 66, the isolation characteristics of the switching device 102 are improved compared to those of the switch 10 alone as indicated by a hatching region.

In the second embodiment, the IDT 24 converts an electrical signal input to the input-output terminal T1 into the acoustic wave 25 propagating through the piezoelectric substrate 22. The IDT 26 converts the acoustic wave 25 propagating through the piezoelectric substrate 22 into an electrical signal. As described above, the delay line 20 is formed with the acoustic wave excited by the comb-shaped electrode formed on the piezoelectric substrate 22. This enables to improve the isolation characteristics of the switching device 102 by appropriately designing the IDTs 24 and 26. Furthermore, the second embodiment can downsize the switching device 102 compared to a technique using an inductor as described in Patent Documents 1 and 2.

As described above, the IDTs 24 and 26 may be formed on the piezoelectric substrate. Or, the IDTs 24 and 26 may be formed on a piezoelectric layer on the substrate.

Third Embodiment

Figure 7A:
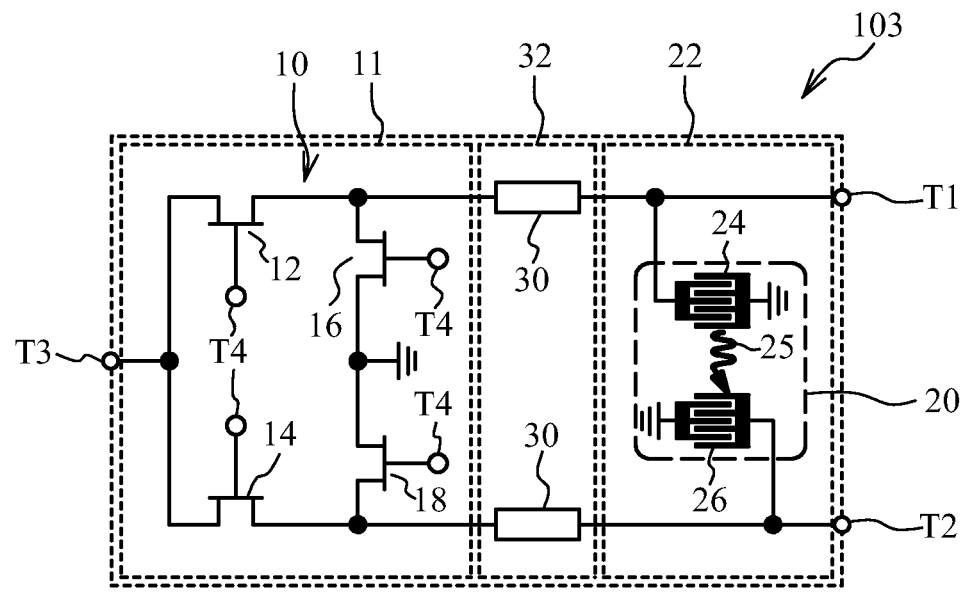
FIG. 7A is a plan view of a switching device in accordance with a third embodiment.
Figure 7B:
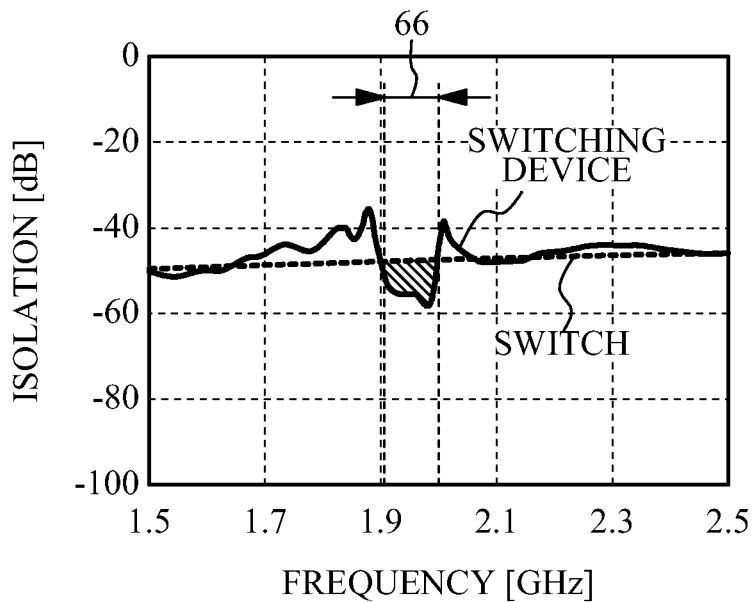
FIG. 7B is a diagram illustrating isolation characteristics of the switching device of the third embodiment.

FIG. 7A is a plan view of a switching device in accordance with a third embodiment, and FIG. 7B is a diagram illustrating isolation characteristics of the switching device of the third embodiment. As illustrated in FIG. 7A, a switching device 103 includes the switch 10, the delay line 20, and transmission lines 30. Two transmission lines 30 are connected between the input-output terminal T1 and the switch 10 and between the input-output terminal T2 and the switch 10. The transmission line 30 is a stripline formed in a dielectric substance substrate 32 for example. Other structures are the same as those of the second embodiment illustrated in FIG. 3A, and a description thereof is omitted.

Isolation characteristics were simulated under the assumption that the transmission line 30 has a characteristic impedance of 50Ω and a length of 1 mm. In FIG. 7B, the solid line indicates simulation results of isolation from the input-output terminal T1 to the input-output terminal T2 of the switching device 103 in FIG. 7A. The dotted line indicates simulation results of isolation from the input-output terminal T1 to the input-output terminal T2 of the switch 10 alone. As described in the third embodiment, the delay line 20 can improve the isolation characteristics even when the transmission line 30 is connected between the switch 10 and the delay line 20. However, the isolation of the switching device 103 in the band 66 deteriorates compared to that of the second embodiment presented in FIG. 6.

The actual switching device has a transmission line to electrically connect the switch 10 to the delay line 20. When the transmission line is long, the improvement effect of the isolation characteristics is small as illustrated in FIG. 7B. To investigate the reason, simulated were isolation, |Y21|, and ∠Y21 of a signal from the input-output terminal T1 to the input-output terminal T2 through the switch 10 and the transmission line 30 without the delay line 20 in FIG. 7A.

Figure 8A:
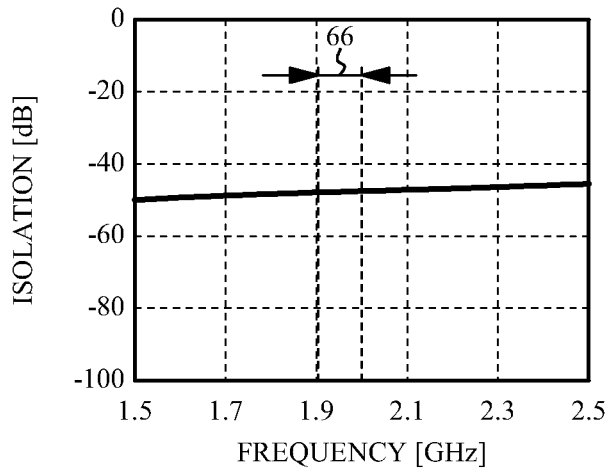
FIG. 8A through FIG. 8C are diagrams respectively illustrating isolation, $|Y21|$, and $\angle Y21$ between input-output terminals of a switch without a delay line.
Figure 8B:
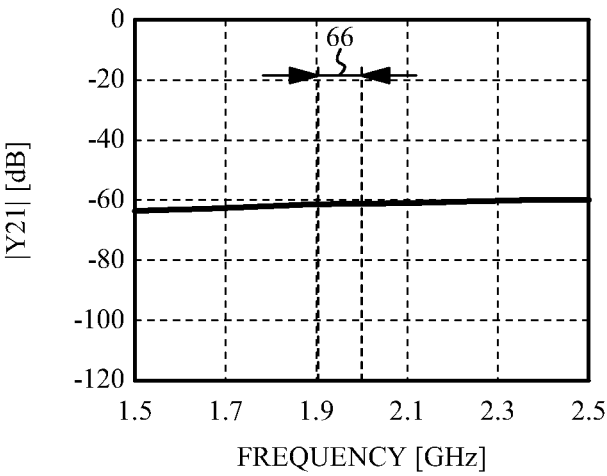
Figure 8C:
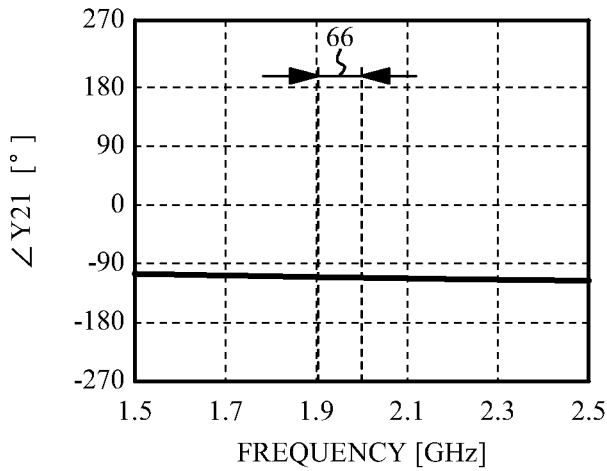

FIG. 8A through FIG. 8C are diagrams respectively illustrating isolation, |Y21|, and ∠Y21 between the input and output terminals of the switch without the delay line. As illustrated in FIG. 8A and FIG. 8B, the isolation and |Y21| are approximately the same as those of FIG. 4A and FIG. 4B. As illustrated in FIG. 8C, ∠Y21 is at a negative side more than −90°. As illustrated, the transmission line 30 further rotates the phase from −90°. Thus, it is considered that the isolation characteristics are not improved as much as those of the second embodiment even though the IDTs 24 and 26 are used as illustrated in FIG. 7B.

Fourth Embodiment

Figure 9:
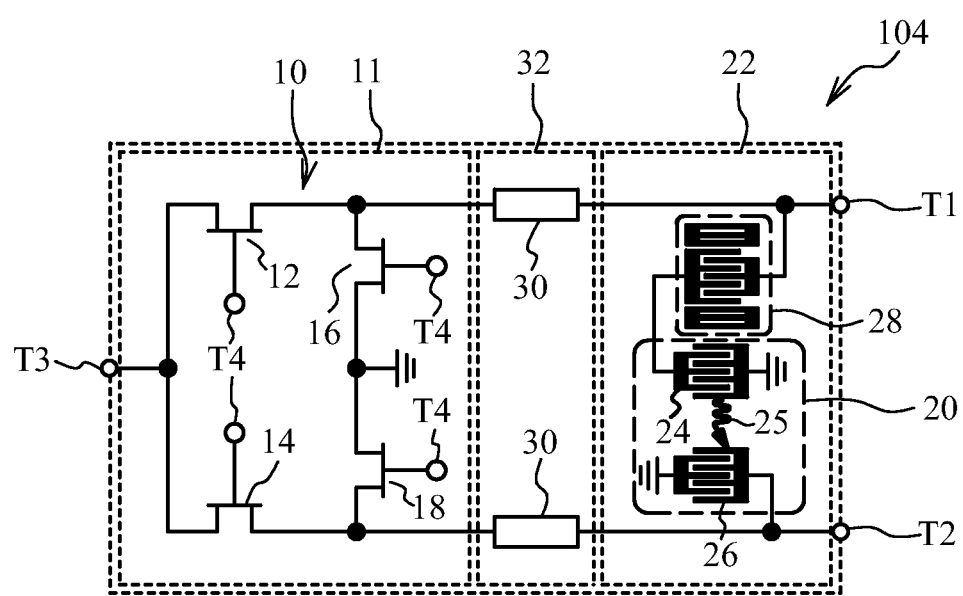
FIG. 9 is a plan view of a switching device in accordance with a fourth embodiment.

FIG. 9 is a plan view of a switching device in accordance with a fourth embodiment. As illustrated in FIG. 9, a one terminal-pair resonator 28 is connected between the input-output terminal T1 and the IDT 24 of the delay line 20.

Figure 10A:
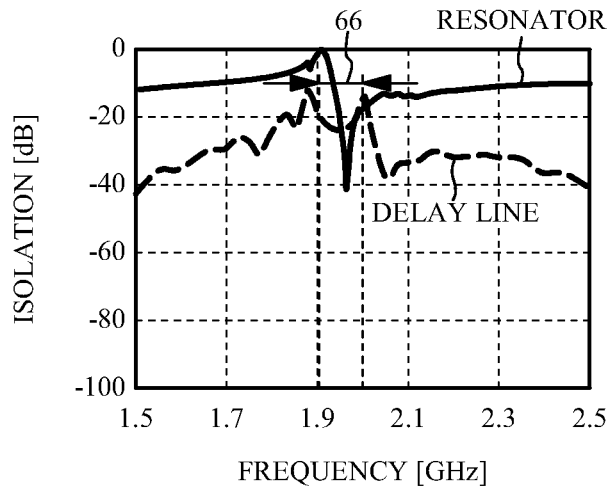
FIG. 10A through FIG. 10C are diagrams illustrating isolation, $|Y21|$, and $\angle Y21$ of a delay line and a resonator.
Figure 10B:
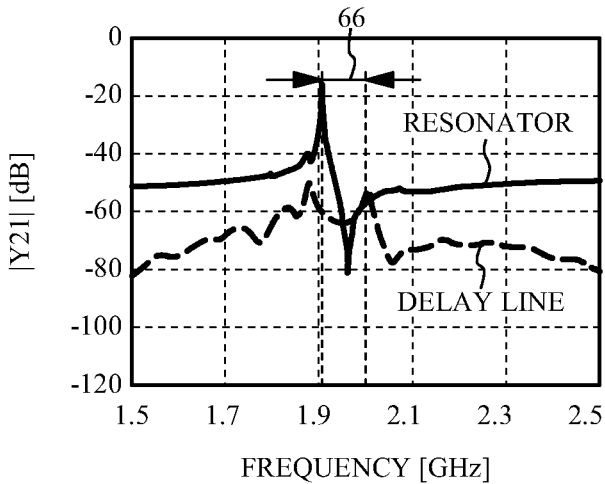
Figure 10C:
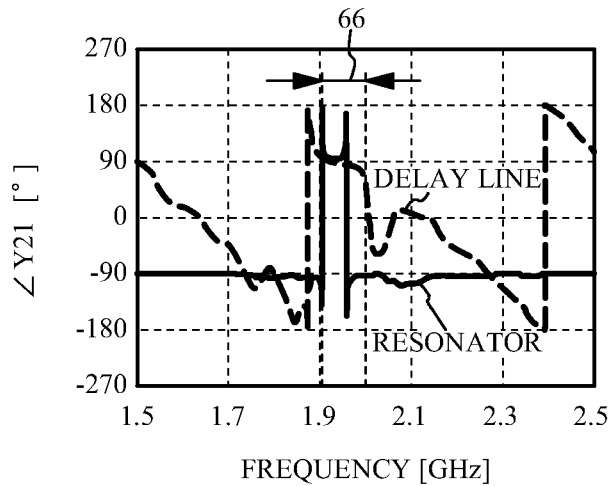

FIG. 10A through FIG. 10C are diagrams respectively illustrating isolation, |Y21|, and ∠Y21 of the delay line and the resonator of the fourth embodiment. The solid lines indicate the resonator 28, and the dotted lines indicate the delay line 20. Isolation, |Y21|, and ∠Y21 were simulated under the following conditions.

Piezoelectric substrate 22: 44° Y-cut lithium tantalate single crystal substrate
IDT 24: number of pairs: 8.5 pairs, pitch: 1.97 µm, aperture length: 72λ
IDT 26: number of pairs: 18.0 pairs, pitch 1.97 µm, aperture length: 72λ
Interval between the IDTs 24 and 26: 0.46 µm
Resonator 28: number of pairs: 14 pairs, pitch: 2.0 µm, aperture length: 17λ
λ is the wavelength of the acoustic wave.

|Y21| of the delay line 20 in the band 66 is approximately equal to that of the switch 10. ∠Y21 of the delay line 20 in the band 66 is approximately 90°. As described above, it is difficult to shift ∠Y21 from 90° by using only the delay line 20. The resonance point and the anti-resonance point of the resonator 28 are located in the band 66.

Figure 11A:
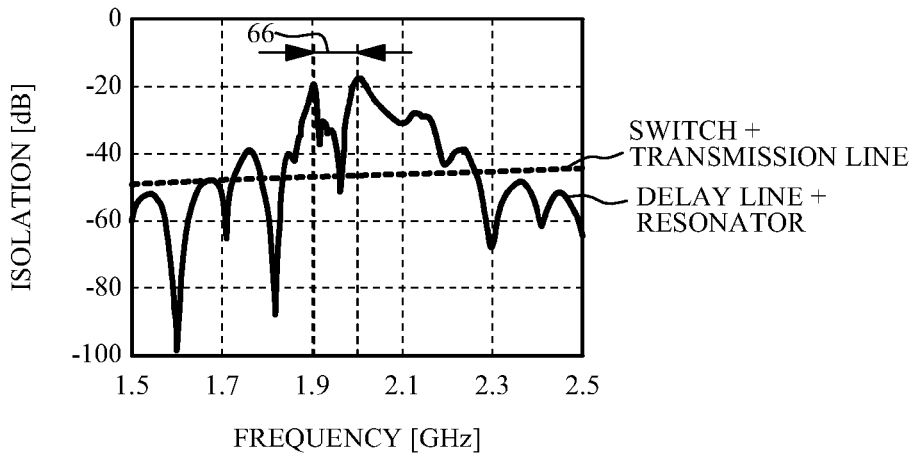
FIG. 11A through FIG. 11C are diagrams respectively illustrating isolation, $|Y21|$, and $\angle Y21$ of the delay line and the resonator and of the switch and the transmission line.
Figure 11B:
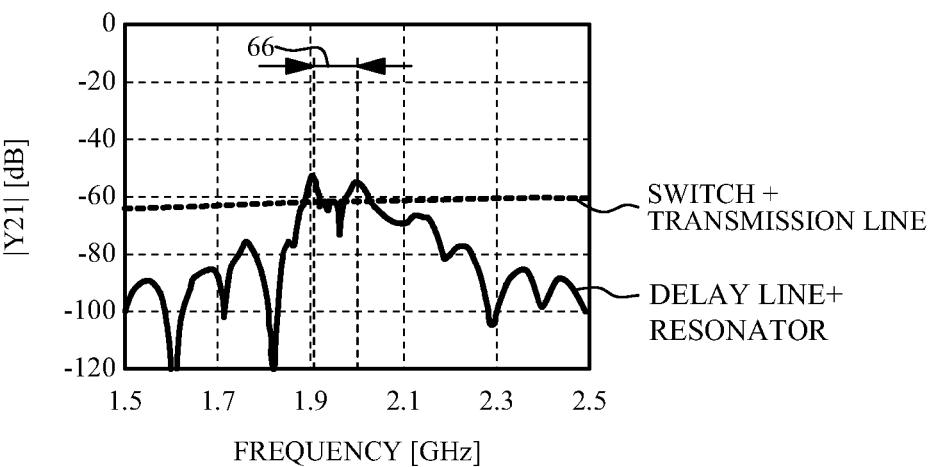
Figure 11C:
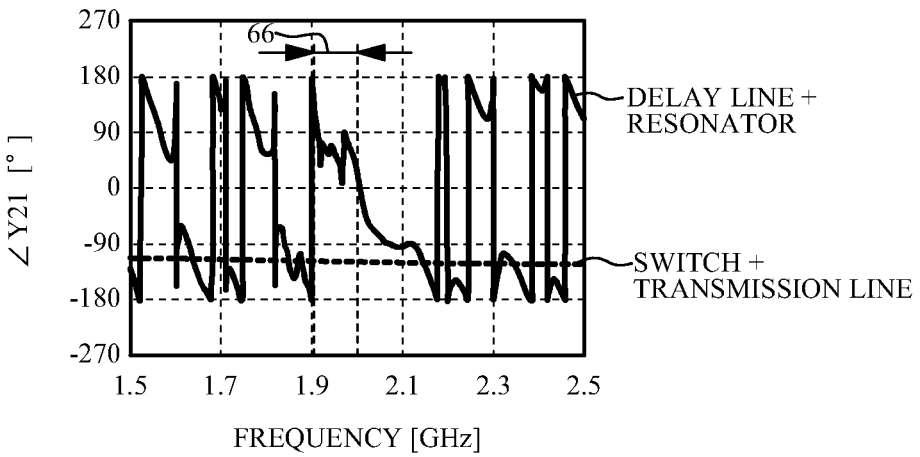

FIG. 11A through FIG. 11C are diagrams respectively illustrating isolation, |Y21|, and ∠Y21 of the delay line and the resonator and of the switch and the transmission line of the fourth embodiment. The solid lines indicate the delay line 20 and the resonator 28, and the dotted lines indicate the switch 10 and the transmission line 30. As illustrated in FIG. 11B, |Y21| of a signal transmitted through the delay line 20 and the resonator 28 is approximately equal to that of a signal transmitted through the switch 10 and the transmission line 30. As illustrated in FIG. 11C, ∠Y21 of the signal transmitted through the delay line 20 and the resonator 28 is slightly less than 90°. This makes the signal transmitting through the delay line 20 and the resonator 28 have an opposite phase to the signal transmitting through the switch 10 and the transmission line 30.

Figure 12:
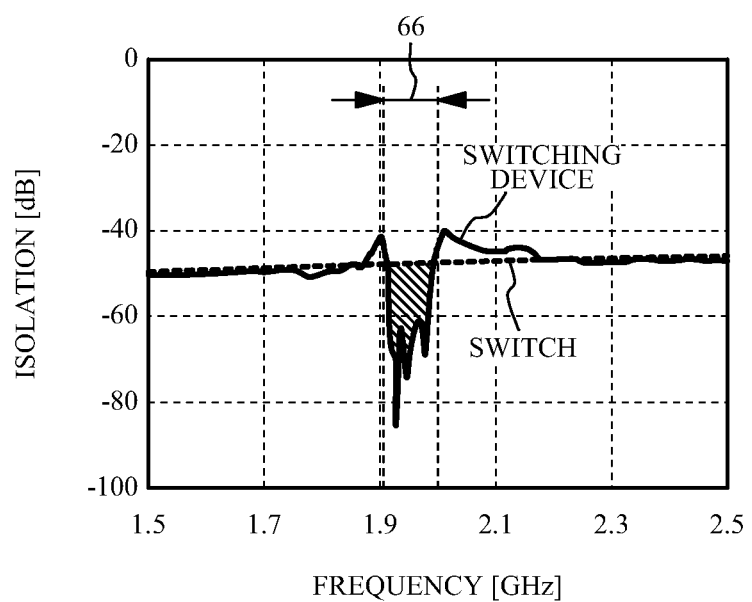
FIG. 12 is a diagram illustrating isolation characteristics of the switching device in accordance with the fourth embodiment.

FIG. 12 is a diagram illustrating isolation characteristics of the switching device of the fourth embodiment. The solid line indicates simulation results of isolation from the input-output terminal T1 to the input-output terminal T2 of a switching device 104. The dotted line indicates simulation results of isolation from the input-output terminal T1 to the input-output terminal T2 of the switch 10 alone. As illustrated in FIG. 12, in the band 66, the isolation characteristics of the switching device 104 are improved compared to those of the switch 10 alone. In addition, the isolation characteristics are improved compared to those of the third embodiment.

In the fourth embodiment, the resonator 28 is connected in series with the delay line 20 between the input-output terminals T1 and T2. The design constant of the resonator 28 can be optimized in addition to the delay line 20, and thus the isolation characteristics can be optimized even when the transmission line 30 exists. The fourth embodiment describes a case where the resonator 28 is connected between the IDT 24 and the input-output terminal T1, but a resonator may be connected between the IDT 26 and the input-output terminal T2. In addition, resonators may be connected between the IDT 24 and the input-output terminal T1 and between the IDT 26 and the input-output terminal T2. The resonator may be a resonator other than a one terminal-pair resonator.

Figure 13A:
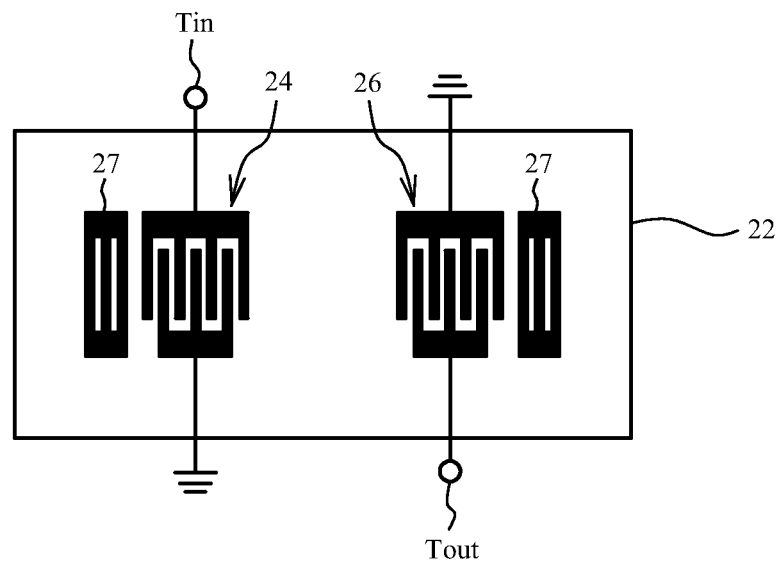
FIG. 13A and FIG. 13B are plan views illustrating exemplary delay lines used in the second to fourth embodiments.
Figure 13B:
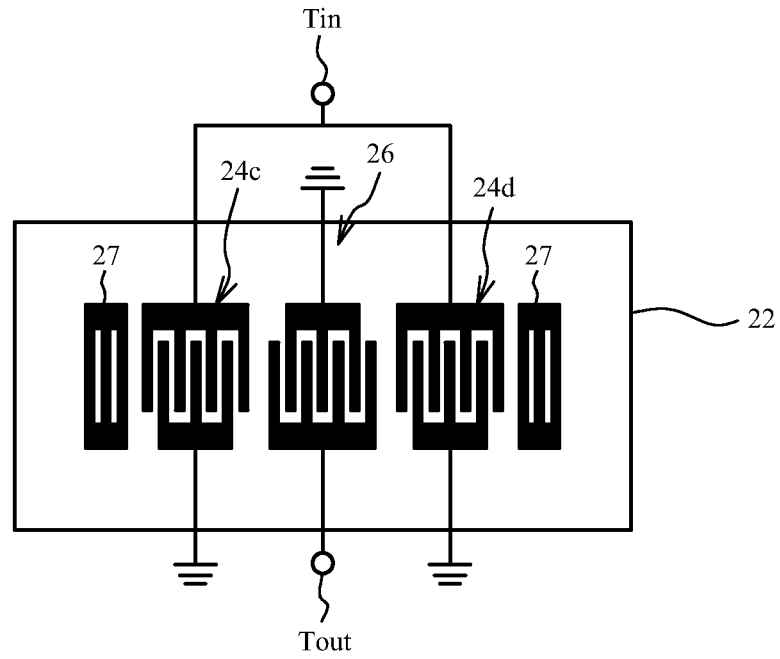

FIG. 13A and FIG. 13B are plan views illustrating exemplary delay lines used in the second to fourth embodiments. As illustrated in FIG. 13A, reflectors 27 may be located at both sides or a single side of the IDTs 24 and 26 in the propagation direction of the acoustic wave. As illustrated in FIG. 13B, IDTs 24c and 24d may be coupled to the input terminal Tin. In addition, two or more IDTs may be coupled to the output terminal Tout, and two or more IDTs may be coupled to both the input terminal Tin and the output terminal Tout. A surface acoustic wave is described as an example of the acoustic wave excited by the comb-shaped electrode, but a boundary acoustic wave or a Love wave may be used as the acoustic wave.

Figure 14A:
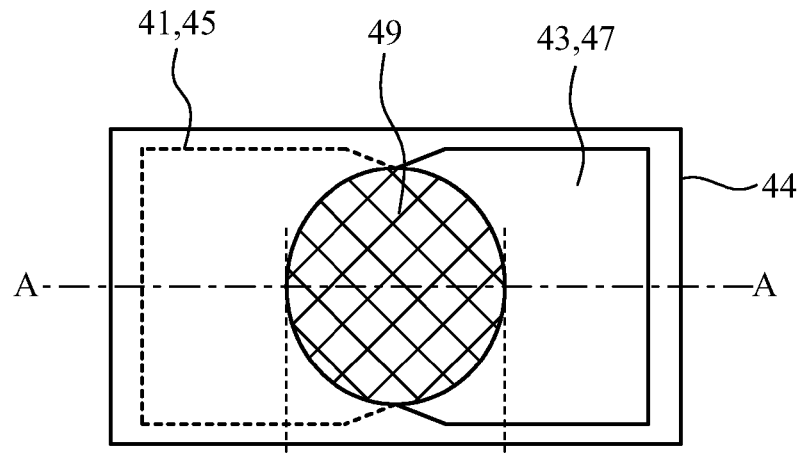
FIG. 14A is a plan view illustrating an alternative exemplary delay line used in the second to fourth embodiments.
Figure 14B:
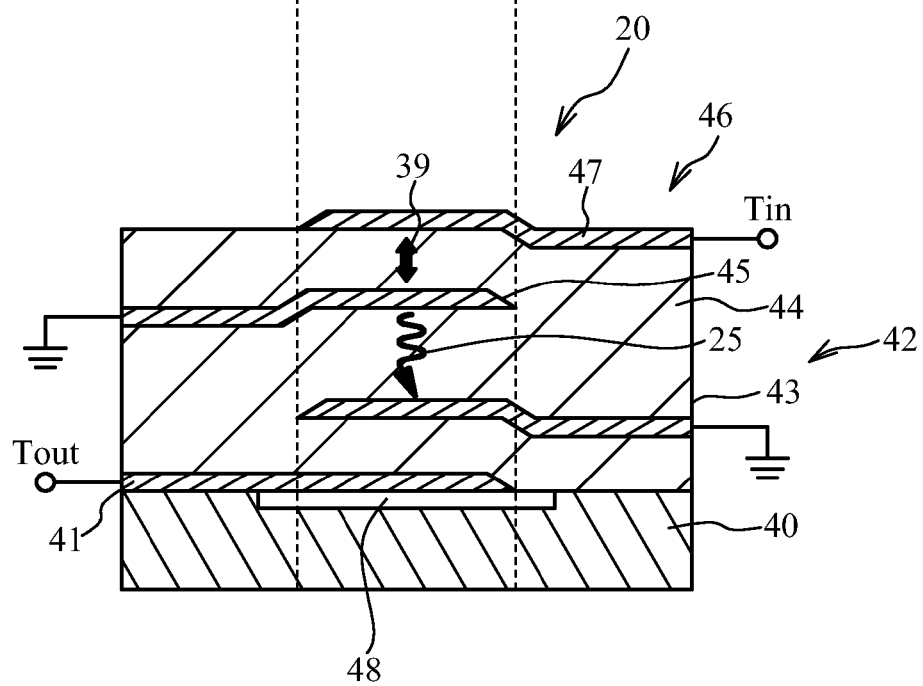
FIG. 14B is a cross-sectional view taken along line A-A in FIG. 14A.

FIG. 14A is a plan view illustrating an alternative exemplary delay line used in the second to fourth embodiments, and FIG. 14B is a cross-sectional view taken along line A-A in FIG. 14A. As illustrated in FIG. 14A and FIG. 14B, a piezoelectric thin film resonator 42 is located on a substrate 40 through an air-space 48, and a piezoelectric thin film resonator 46 is stacked on the piezoelectric thin film resonator 42 through a piezoelectric layer 44. The piezoelectric thin film resonator 42 (second piezoelectric thin film resonator) is formed by stacking a lower electrode 41, the piezoelectric layer 44, and an upper electrode 43. The piezoelectric thin film resonator 46 (first piezoelectric thin film resonator) is formed by stacking a lower electrode 45, the piezoelectric layer 44, and an upper electrode 47. A resonance region 49 is a region where the lower electrode 41 or 45 overlaps with the upper electrode 43 or 47 across the piezoelectric layer 44.

The upper electrode 47 of the piezoelectric thin film resonator 46 is coupled to the input terminal Tin, and the lower electrode 45 is grounded. The lower electrode 41 of the piezoelectric thin film resonator 42 is coupled to the output terminal Tout, and the upper electrode 43 is grounded. The input terminal Tin is coupled to the input-output terminal T1, and the output terminal Tout is coupled to the input-output terminal T2. A thickness vibrator 39 of the piezoelectric thin film resonator 46 excites the acoustic wave 25 in the piezoelectric layer 44. As described above, the piezoelectric thin film resonator 46 converts an electrical signal input to the input terminal Tin into the acoustic wave 25 propagating through the piezoelectric layer 44. The acoustic wave 25 propagates from the piezoelectric thin film resonator 46 to the piezoelectric thin film resonator 42. The piezoelectric thin film resonator 42 converts the acoustic wave 25 into an electrical signal, and outputs it to the output terminal Tout.

As described above, the acoustic wave excited by the thickness vibrator using the piezoelectric layer 44 may be used for the delay line 20 and/or the resonator 28. The piezoelectric thin film resonators 42, 46 may be located on the substrate 40 through an acoustic multilayer film reflecting the acoustic wave.

Fifth Embodiment

Figure 15A:
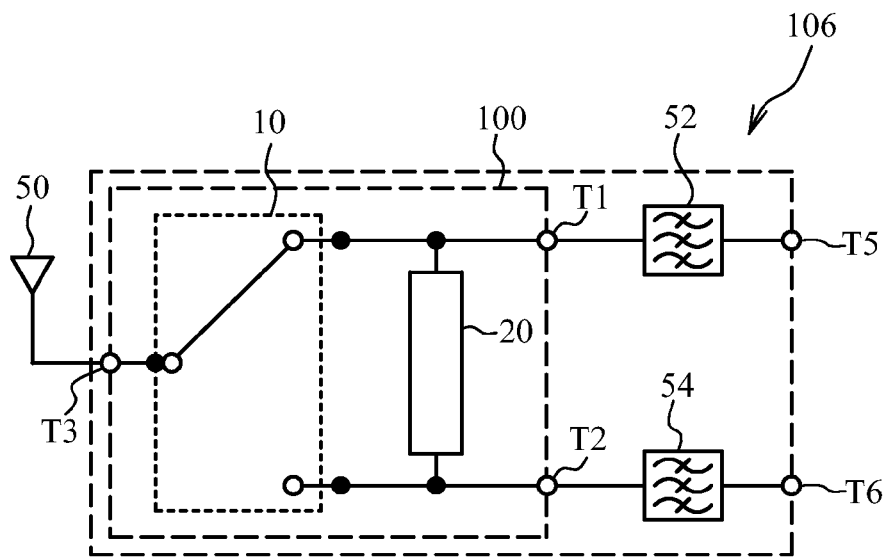
FIG. 15A and FIG. 15B are block diagrams of a module in accordance with a fifth embodiment.
Figure 15B:
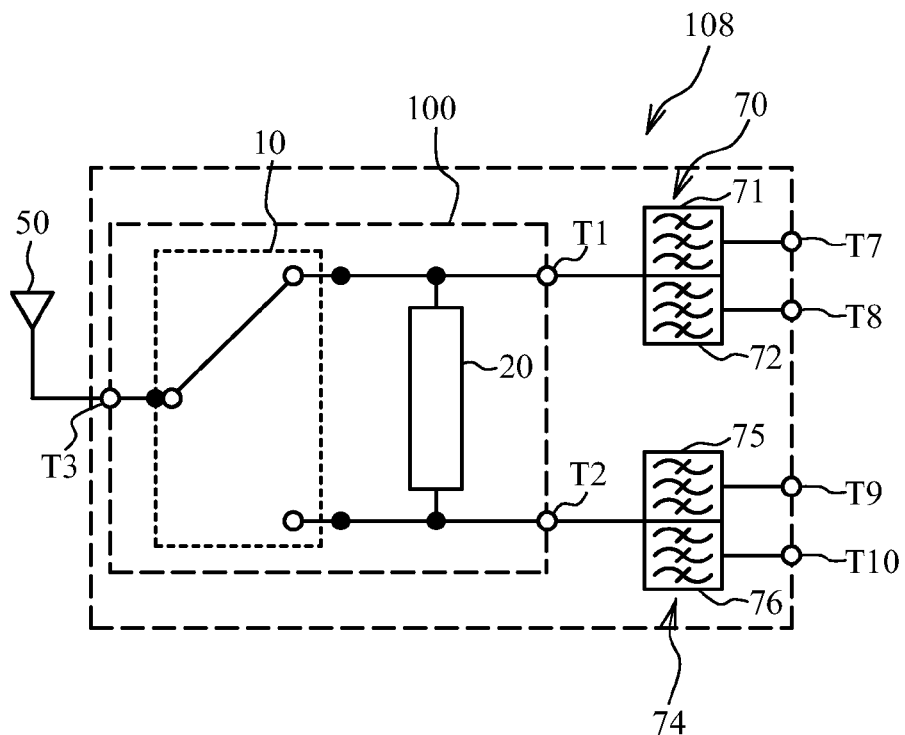

A fifth embodiment is an exemplary module including any one of the switching devices of the first through fourth embodiments. FIG. 15A and FIG. 15B are block diagrams of a module in accordance with the fifth embodiment. As illustrated in FIG. 15A, a module 106 includes the switching device 100 and filters 52 and 54. The filter 52 is connected between the input-output terminal T1 and a terminal T5. The filter 54 is connected between the input-output terminal T2 and a terminal T6. The common terminal T3 is coupled to an antenna 50. Both the terminals T5 and T6 are transmit terminals, or receive terminals, or one of the terminals T5 and T6 is a transmit terminal and the other one is a receive terminal.

As illustrated in FIG. 15B, a module 108 includes the switching device 100 and duplexers 70 and 74. The duplexer 70 includes a transmit filter 71 and a receive filter 72. The transmit filter 71 is connected between the input-output terminal T1 and a terminal T7. The receive filter 72 is connected between the input-output terminal T1 and a terminal T8. The duplexer 74 includes a transmit filter 75 and a receive filter 76. The transmit filter 75 is connected between the input-output terminal T2 and a terminal T9. The receive filter 76 is connected between the input-output terminal T2 and a terminal T10. The common terminal T3 is coupled to the antenna 50.

As described in the fifth embodiment, the input-output terminals T1 and T2 may be coupled to the filter or the duplexer. An acoustic wave filter may be used for the filter or the duplexer.

Although the embodiments of the present invention have been described in detail, it is to be understood that the various change, substitutions, and alterations could be made hereto without departing from the spirit and scope of the invention.

What is claimed is:

1. A switching device having a plurality of input-output terminals and a common terminal that are to be connected to external devices, the switching device comprising:
   a switch connected to the plurality of input-output terminals and the common terminal, the switch selecting one of the plurality of input-output terminals and connecting said selected one of the plurality of input-output terminals to the common terminal; and
   a delay line that is connected in parallel to the switch between two input-output terminals among the plurality of input-output terminals, the delay line comprising:
      a first IDT that is formed on a piezoelectric layer and that converts a first electrical signal input from one of the two input-output terminals into an acoustic wave propagating through the piezoelectric layer; and
      a second IDT that is formed on the piezoelectric layer and that receives and converts the acoustic wave propagating through the piezoelectric layer into a second electrical signal and outputs the second electrical signal to another of the two input-output terminals.

2. A switching device having a plurality of input-output terminals and a common terminal that are to be connected to external devices, the switching device comprising:
   a switch connected to the plurality of input-output terminals and the common terminal, the switch selecting one of the plurality of input-output terminals and connecting said selected one of the plurality of input-output terminals to the common terminal; and
   a delay line that is connected in parallel to the switch between two input-output terminals among the plurality of input-output terminals, the delay line comprising:
      a first piezoelectric thin film resonator that includes a first piezoelectric layer, a first lower electrode, and a first upper electrode, the first lower electrode and the first upper electrode sandwiching the first piezoelectric layer, the first piezoelectric thin film resonator converting a first electrical signal input from one of the two input-output terminals into an acoustic wave; and
      a second piezoelectric thin film resonator that includes a second piezoelectric layer, a second lower electrode, and a second upper electrode, the second lower electrode and the second upper electrode sandwiching the second piezoelectric layer; and
      a third piezoelectric layer formed between the first piezoelectric thin film resonator and the second piezoelectric thin film resonator such that the acoustic wave generated by the first piezoelectric thin film resonator as a result of said conversion of the first electrical signal propagates through the third piezoelectric layer and is received by the second piezoelectric thin film resonator, the second piezoelectric thin film resonator converting the received acoustic wave into a second electrical signal and outputs the second electrical signal to another of the two input-output terminals.

3. The switching device according to claim 1, further comprising:
   a resonator electrically connected in series between the first IDT and said one of the two input-output terminals and/or between the second IDT and another of the two input-output terminals.

4. The switching device according to claim 1, wherein the switch is a semiconductor switch.

5. A module comprising:
   the switching device according to claim 1.

6. The module according to claim 5, further comprising:
   filters connected to the two input-output terminals, respectively.

7. The switching device according to claim 1, wherein a third signal passing through the switch from said one of the two input-output terminals to another of the two input-output terminals and the second signal emerging from the delay line to another of the two input-output terminals have a substantially identical amplitude and have substantially opposite phases.

8. The switching device according to claim 1, wherein
the first IDT includes a first comb-shaped electrode connected to a ground and a second comb-shaped electrode connected to said one of the two input-output terminals, and
the second IDT includes a third comb-shaped electrode connected to a ground and a fourth comb-shaped electrode connected to another of the two input-output terminals.

9. The switching device according to claim 1, wherein
no electrode is formed on the piezoelectric layer between the first IDT and the second IDT.

10. The switching device according to claim 3, wherein the resonator includes a third IDT formed on the piezoelectric layer and connected in series between the first IDT and said one of the two input-output terminals and/or between the second IDT and another of the two input-output terminals.

* * * * *